United States Patent
Chrobak et al.

(10) Patent No.: US 7,641,349 B1
(45) Date of Patent: Jan. 5, 2010

(54) SYSTEMS AND METHODS FOR COLLECTOR MIRROR TEMPERATURE CONTROL USING DIRECT CONTACT HEAT TRANSFER

(75) Inventors: Christopher P. Chrobak, San Diego, CA (US); Igor V. Fomenkov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 12/284,585

(22) Filed: Sep. 22, 2008

(51) Int. Cl.
*G02B 5/08* (2006.01)

(52) U.S. Cl. ..................................... 359/845

(58) Field of Classification Search ................. 359/845, 359/846, 848
See application file for complete search history.

(56) References Cited

U.S. PATENT DOCUMENTS

| | | | |
|---|---|---|---|
| 5,091,244 A | 2/1992 | Bionard | 428/216 |
| 5,265,143 A | 11/1993 | Early et al. | 378/84 |
| 5,356,662 A | 10/1994 | Early et al. | 427/140 |
| 5,698,113 A | 12/1997 | Baker et al. | 216/72 |
| 5,737,137 A | 4/1998 | Cohen et al. | 359/859 |
| 6,359,678 B1 * | 3/2002 | Ota | 355/53 |
| 6,549,551 B2 | 4/2003 | Ness et al. | 372/38.07 |
| 6,567,450 B2 | 5/2003 | Myers et al. | 372/55 |
| 6,625,191 B2 | 9/2003 | Knowles et al. | 372/55 |
| 6,634,760 B2 | 10/2003 | Folta et al. | 359/883 |
| 6,822,251 B1 | 11/2004 | Arenbert et al. | 250/504 R |
| 7,081,992 B2 | 7/2006 | Tichenor et al. | 359/359 |
| 7,098,994 B2 | 8/2006 | Moors et al. | 355/71 |
| 7,164,144 B2 | 1/2007 | Partlo et al. | 250/504 R |
| 7,193,228 B2 | 3/2007 | Bowering et al. | 250/504 R |
| 7,196,342 B2 | 3/2007 | Ershov et al. | 250/504 R |
| 7,217,940 B2 | 5/2007 | Partlo et al. | 250/504 R |
| 7,329,876 B2 | 2/2008 | Schuermann et al. | 250/372 |
| 7,349,063 B2 * | 3/2008 | Miyajima | 355/30 |
| 7,372,056 B2 | 5/2008 | Bykanov et al. | 250/504 R |
| 7,388,220 B2 | 6/2008 | Fomenkov et al. | 250/504 R |
| 7,405,416 B2 | 7/2008 | Alogts et al. | 250/493.1 |
| 7,439,530 B2 | 10/2008 | Ershov et al. | 250/504 R |
| 7,465,946 B2 | 12/2008 | Bowering et al. | 250/504 R |
| 7,491,954 B2 | 2/2009 | Bykanov et al. | 250/504 R |
| 2003/0146391 A1 | 8/2003 | Kleinschmidt et al. | 250/372 |
| 2005/0105066 A1 | 5/2005 | Franken | 355/30 |
| 2006/0028627 A1 | 2/2006 | Box | 355/30 |

(Continued)

FOREIGN PATENT DOCUMENTS

CA     2591530     12/2005

(Continued)

OTHER PUBLICATIONS

U.S. Appl. No. 12/004,871, filed Dec. 20, 2007, Bowering et al.

(Continued)

*Primary Examiner*—Euncha P Cherry
(74) *Attorney, Agent, or Firm*—Matthew K. Hillman

(57) ABSTRACT

As disclosed herein, a device may comprise an optic disposed in a near vacuum environment, the optic formed with a surface portion; a temperature controlled member formed with a surface portion conforming to the optic surface portion; and a liquid interposed between the optic surface portion and the member surface portion to conduct heat therebetween.

20 Claims, 4 Drawing Sheets

U.S. PATENT DOCUMENTS

| | | | |
|---|---|---|---|
| 2006/0219957 A1 | 10/2006 | Ershov et al. | 250/504 R |
| 2006/0255298 A1 | 11/2006 | Bykanov et al. | 250/504 R |
| 2007/0187627 A1 | 8/2007 | Ershov et al. | 250/504 R |
| 2008/0004871 A1 | 1/2008 | Arslan et al. | |
| 2008/0043321 A1 | 2/2008 | Bowering et al. | 359/359 |
| 2009/0014668 A1 | 1/2009 | Vaschenko | 240/504 R |

FOREIGN PATENT DOCUMENTS

| | | |
|---|---|---|
| JP | 2007134166 | 5/2007 |
| JP | 2007200671 | 8/2007 |
| WO | 02003/007312 | 1/2003 |
| WO | 02005/091076 | 9/2005 |

OTHER PUBLICATIONS

U.S. Appl. No. 12/221,313, filed Jul. 31, 2008, Chavez et al.

Bico, J., et al., "Rough wetting", Europhys. Lett. 55 (2), pp. 214-220 (2001).

Early, K., et al.; "Repair of soft-x-ray optical elements by stripping and redeposition of Mo/Si reflective coatings"; J. Vac. Scl. Technol. B 11(6), pp. 2926-2929; Nov/Dec 1993.

Elton, N.J.; "An introduction to roughness and refractive index"; Surfoptic Ltd.; Materials Charactersation By Light Scattering and Reflectometry; pp. 1-7; 2004.

Krumrey, M., et al.; "Repair of high performance multilayer coatings"; SPIE vol. 1547 Multilayer Optics for Advanced X-Ray Applications 1991.

Mirkarimi, P., et al.,: "Recovery of multilayer-coated Zerodur and ULE optics for extreme-ultraviolet lithography by recoating, reactive-ion etching, and wet chemical processes"; Applied Optics; vol. 40, No. 1; Jan. 2001.

Korde, R., et al., "EUV Photodiodes with Directly Deposited Uranium Filter"; presented at EUVL Symposium, San Diego, Nov. 2005.

Lazar, G., et al., "Infrared Absorption Properties of Amorphous Carbon Films," J. of Optoelectronics and Advanced Materials, vol. 7, No. 2, Apr. 2005, pp. 647-652.

Salmassi, F., et al., "EUV Binary Phase Gratings: Fabrication and Application to Diffractive Optics"; Lawrence Berkeley National Laboratory, University of California; Paper LBNL'56785-Journal 2005.

Stover, J., "Interpreting Light Scatter Measurements"; Schmitt Measurement Systems, Inc.; Apr. 1994.

Sundaram, K., et al.,; "Wet etching studies of silicon nitride thin films deposited by electron cyclotron resonance (ECR) plasma enhanced chemical vapor deposition"; Microelectronic Engineering 70, pp. 109-114, (2003).

Wang, Y., et al., "Investigation of a Novel Flat Heat Pipe", Journal of Heat Transfer, vol. 127; pp. 165-170 (2005).

* cited by examiner

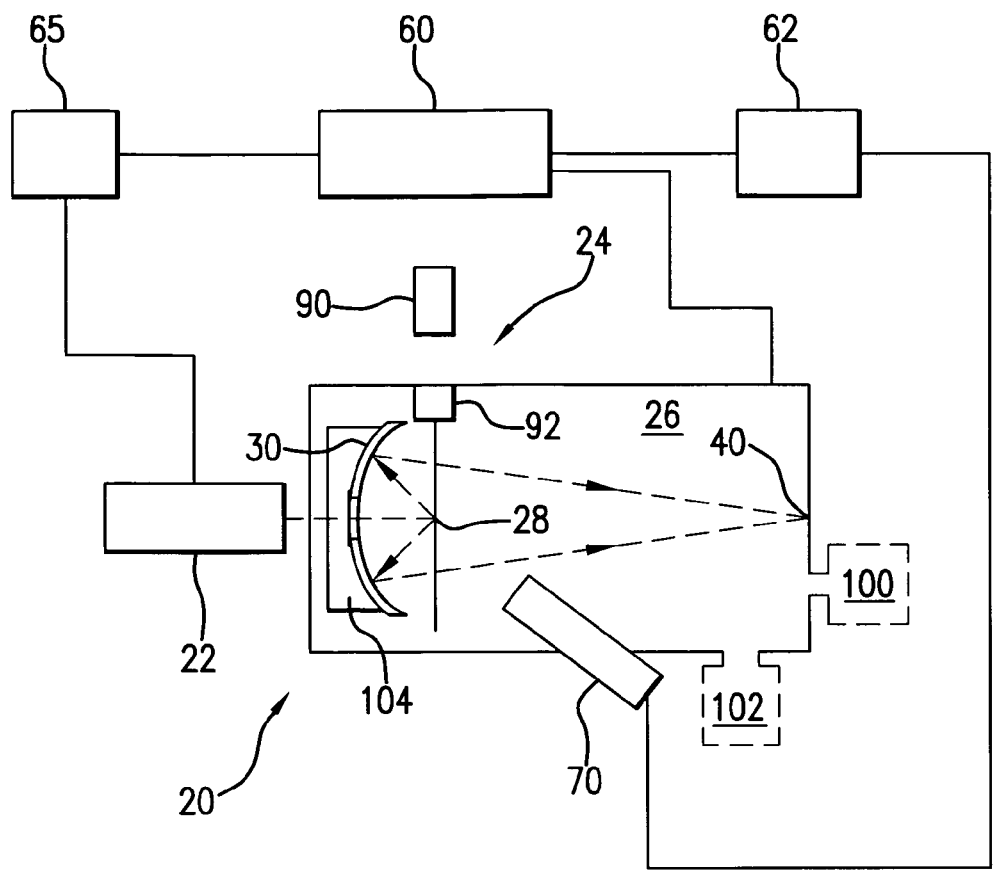
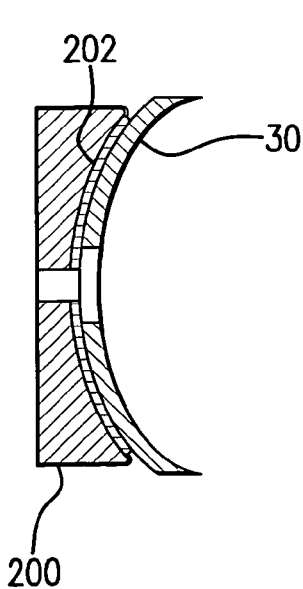 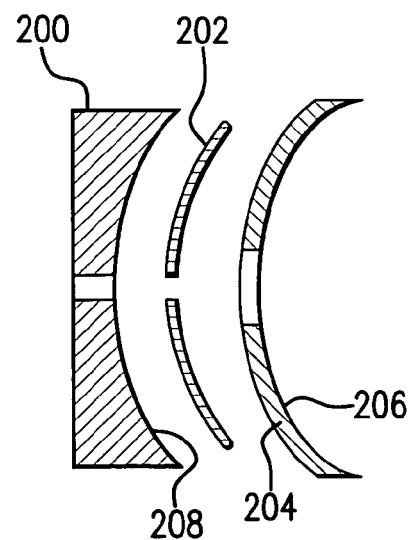
FIG. 1
FIG. 2   FIG. 3

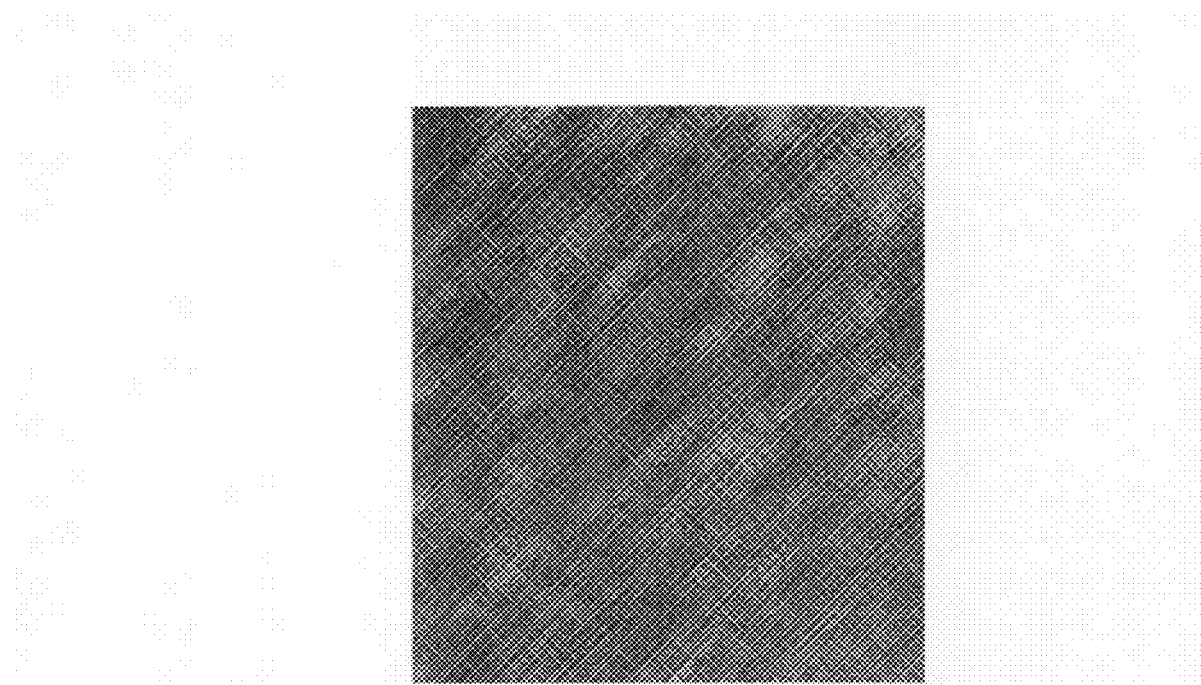
FIG. 6
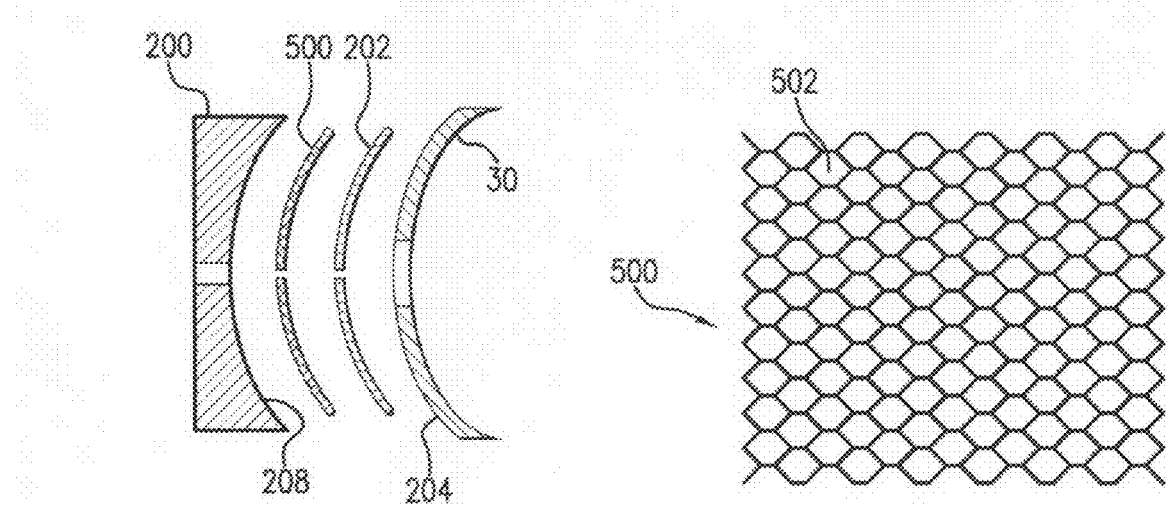
FIG. 7
FIG. 8

SYSTEMS AND METHODS FOR COLLECTOR MIRROR TEMPERATURE CONTROL USING DIRECT CONTACT HEAT TRANSFER

CROSS-REFERENCE TO RELATED APPLICATIONS

The present application is related to U.S. patent application Ser. No. 12/221,313 filed on Jul. 31, 2008, entitled SYSTEMS AND METHODS FOR HEATING AN EUV COLLECTOR MIRROR; U.S. patent application Ser. No. 12/004,871 filed on Dec. 20, 2007, entitled EUV LIGHT SOURCE COMPONENTS AND METHODS FOR PRODUCING, USING AND REFURBISHING SAME; and U.S. Pat. No. 7,388,220 filed on Jul. 27, 2004, entitled EUV LIGHT SOURCE; the entire contents of each of which are hereby incorporated by reference herein.

FIELD

The present application relates to extreme ultraviolet ("EUV") light sources providing EUV light from a plasma created from a material and collected and directed to a focus for utilization outside of the EUV light source chamber, e.g., for semiconductor integrated circuit manufacturing photolithography e.g., at wavelengths of around 50 nm and below.

BACKGROUND

EUV light, e.g., electromagnetic radiation in the EUV spectrum (i.e. having wavelengths of about 5-100 nm), may be useful in photolithography processes to produce extremely small features, e.g., sub-32 nm features, in semiconductor substrates, such as silicon wafers.

Methods to produce EUV light include, but are not necessarily limited to, converting a material into a plasma state that has one or more elements, e.g., xenon, lithium or tin, indium, antimony, tellurium, aluminum, etc., with one or more emission line(s) in the EUV spectrum. In one such method, often termed laser produced plasma ("LPP"), a plasma can be produced by irradiating a target material, such as a droplet, stream, or cluster of material having the line-emitting element, with a laser beam. Another method involves disposing the line-emitting element between two electrodes. In this method, often termed discharge produced plasma ("DPP"), a plasma can be produced by creating an electrical discharge between the electrodes.

For these processes, the plasma is typically produced in a sealed vessel, e.g., chamber that has been evacuated to produce a near vacuum environment, and monitored using various types of metrology equipment. A typical EUV light source may also include one or more EUV mirrors that are positioned in the near vacuum environment distanced from the plasma site, and oriented to direct EUV light emitted from the plasma to an EUV light source output location. In general, these EUV mirrors may be either grazing incidence-type mirrors, or near-normal incidence type mirrors. e.g., a substrate covered with a multi-layer coating such as Mo/Si. By way of example, for an LPP setup, the mirror may be in the form of a truncated prolate spheroid having a circular cross-section normal to a line passing through its foci, and having elliptical cross-sections in planes that include the line passing through the foci. In some cases, the mirror may be formed with an aperture to allow the laser light to pass through and reach the irradiation site. With this arrangement, the irradiation site may be positioned at or near a first focus of the prolate spheroid, and the light source output may be positioned at, near or downstream of the second focus.

Several factors may be considered when selecting a substrate material for an EUV mirror. These can include temperature stability, vacuum compatibility, chemical stability, manufacturability, including the ability of the material to be easily shaped and polished, thermal mass, as well as material availability and cost. With these factors in mind, substrate candidates can include silicon (single crystal and polycrystalline) and silicon carbide. Typically, these mirrors are designed to operate within a preselected temperature range. Exposure of the mirror to temperatures outside the temperature range can include undesirable shape changes due to thermal expansion/contraction and/or a reduction in the efficiency of the multi-layer coating due to interlayer diffusion, etc.

In addition to generating EUV radiation, these plasma processes described above may also generate undesirable by-products, so-called debris, in the plasma chamber which can include high energy ions and/or atoms, target material vapor and/or clumps/micro-droplets of the target material. These plasma formation by-products can potentially damage and/or reduce the operational efficiency of the various plasma chamber optical elements including, but not limited to, the mirrors described above, the surfaces of metrology detectors, windows used to image the plasma formation process, and the input window allowing the laser to enter the plasma chamber. The debris may be damaging to the optical elements in a number of ways, including coating them with materials which reduce light transmission, penetrating into them and, e.g., damaging structural integrity and/or optical properties, e.g., the ability of a mirror to reflect light at such short wavelengths, corroding, roughening or eroding them and/or diffusing into them.

Accessing contaminated or damaged optical elements in the plasma chamber for the purpose of cleaning or replacing the elements can be expensive, labor intensive and time-consuming. In particular, these systems typically require a rather complicated and time-consuming purging and vacuum pump-down of the plasma chamber prior to a re-start after the plasma chamber has been opened. This lengthy process can adversely affect production schedules and decrease the overall efficiency of light sources for which it is typically desirable to operate with little or no downtime.

For some target materials, e.g., tin, it may be desirable to introduce an etchant, e.g., $Cl_2$, $Br_2$, HBr, HI, HCl, $H_2$, $CF_3$, $CH_4$, H radicals, some other halogen-containing compound, or combinations thereof, into the plasma chamber to etch material, e.g., debris that has deposited on the optical elements. This etchant may be present during light source operation, during periods of non-operation, or both. To increase the efficacy of these etchants, it may be desirable to heat and/or cool the mirror to maintain the affected surfaces within a preselected temperature range to initiate reaction and/or increase the chemical reaction rate of the etchant and/or to maintain the etching rate at a certain level. For other target materials, e.g., lithium, it may be desirable to heat the affected surfaces where lithium debris has deposited to a temperature sufficient vaporize at least a portion of the deposited material, e.g., a temperature in the range of about 400 to 550 degrees C. to vaporize Li from the surface, with or without the use of an etchant.

Depending on the light source configuration, the above-described heating/cooling may be applied during EUV light source operation (i.e., while a plasma is being generated) and/or during startup, e.g., until the optic receives sufficient heat from another source such as the plasma and/or during periods of EUV light source downtime, e.g. to assist in offline optic cleaning.

With the above in mind, applicants disclose systems and methods for collector mirror temperature control using direct contact heat transfer.

SUMMARY

In a first aspect, a device may comprise an optic disposed in a near vacuum environment, the optic formed with a surface portion; a temperature controlled member formed with a surface portion conforming to the optic surface portion; and a liquid interposed between the optic surface portion and the member surface portion to conduct heat therebetween.

In one embodiment, at least one of the member surface portion and the optic surface portion may be formed with a solid texture to promote spontaneous invasion of the liquid by interfacial surface tension.

In one implementation, the liquid may be a metal which comprises an element selected from the group of elements consisting of mercury, gallium, tin and indium.

In one arrangement, a structure formed with a plurality of through-holes may be interposed between the member surface portion and the optic surface portion to retain the liquid between the surfaces by interfacial surface tension, and in a particular arrangement, the structure may be a mesh.

In one design, the optic may be a mirror having a substrate and a surface portion covered with a multi-layer reflective coating.

In one setup, the mirror substrate may be made of a material selected from the group of materials consisting of silicon and silicon carbide.

In a particular construction of this aspect, the temperature controlled member may comprise a conductive block formed with at least one passageway for flowing a heat exchange fluid.

In one case, the temperature controlled member may comprise a conductive block coupled to at least one resistive heater.

In another aspect, a device may comprise an optic, a temperature controlled member; and a non-sealing means for maintaining a liquid metal between the optic and the member to conduct heat therebetween.

In one embodiment of this aspect, the optic may be located in an environment maintained below atmospheric pressure.

In one implementation of this aspect, the non-sealing means may comprise a surface texture formed on at least one of the temperature controlled member and the optic.

In one arrangement of this aspect, the non-sealing means may comprise a structure formed with a plurality of through-holes, the structure interposed between the member and the optic.

In one design of this aspect, the optic may comprise a substrate made of a material comprising silicon.

In one setup of this aspect, the temperature controlled member may comprise a conductive block formed with at least one passageway for flowing a heat exchange fluid therethrough.

In a particular construction of this aspect, the temperature controlled member may comprise a conductive block coupled to at least one resistive heater.

In another aspect, a method may comprise the steps/acts of disposing an optic in a near vacuum environment, the optic formed with a surface portion; providing a temperature controlled member formed with a surface portion conforming to the optic surface portion; and interposing a liquid material between the optic surface portion and the member surface portion to conduct heat therebetween.

In one implementation of this aspect, the interposing step/act may comprise the sub-steps/sub-acts of solidifying the material on at least one of the member surface portion and the optic surface portion; juxtaposing the member surface portion with the optic surface portion; and heating the material to liquefy the material.

In a particular implementation of this aspect, at least one of the member surface portion and the optic surface portion may be formed with a solid texture to promote spontaneous invasion of the liquid by interfacial surface tension.

In one implementation of this aspect, the method may method may further comprise the steps/acts of providing a structure formed with a plurality of through-holes; and positioning the structure between the member surface portion and the optic surface portion to retain the liquid between the surfaces by interfacial surface tension.

BRIEF DESCRIPTION OF THE DRAWINGS

FIG. 1 shows a simplified schematic view of a laser-produced plasma EUV light source according to an aspect of the present disclosure;

FIG. 2 shows a sectional, partially schematic view of a system for controlling the temperature of an optic;

FIG. 3 shows an exploded, sectional, partially schematic view of a system for controlling the temperature of an optic;

FIG. 6 shows one example of a surface texture that may be used to increase wetting between the surface and the liquid material;

FIG. 7 shows a sectional view of another system for controlling the temperature of an optic 30, which may include a temperature controlled member, a thermally conductive material, and a structure formed with a plurality of through-holes;

FIG. 8 shows an example of a structure for use in the embodiment of FIG. 7, formed as a fine mesh having a plurality of hexagonal openings;

DETAILED DESCRIPTION

Figure 4:
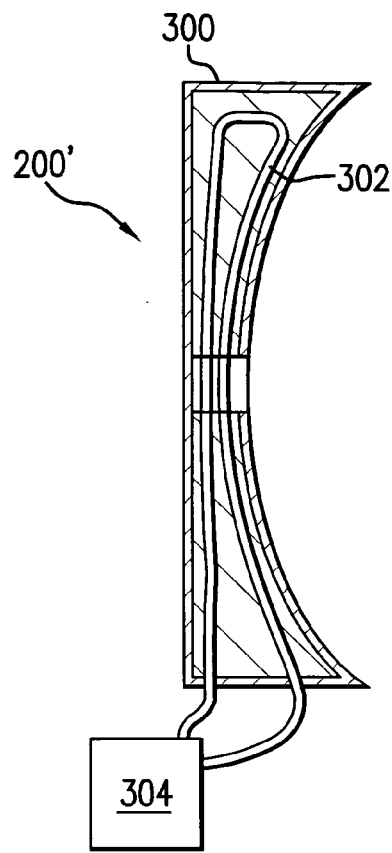
FIG. 4 shows a sectional view an embodiment of a temperature controlled member formed with one or more passageways operable connected to a system for flowing a heat exchange fluid through the passageway(s)

With initial reference to FIG. 1, there is shown a schematic view of an EUV light source, e.g., a laser-produced-plasma, EUV light source 20 according to one aspect of an embodiment. As shown in FIG. 1, and described in further detail below, the light source 20 may include a system 22 for generating a train of light pulses and delivering the light pulses into a chamber 26. For the light source 20, each light pulse may travel along a beam path from the system 22, and into the chamber 26 to illuminate a respective target droplet at an irradiation region 28.

Suitable lasers for use as the system device 22 shown in FIG. 1 may include a pulsed laser device, e.g., a pulsed gas discharge $CO_2$ laser device producing radiation at 9.3 μm or 10.6 μm, e.g., with DC or RF excitation, operating at relatively high power, e.g., 10 kW or higher, and high pulse repetition rate, e.g., 50 kHz or more. In one particular implementation, the laser may be an axial-flow, RF-pumped $CO_2$ having a MOPA configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, steered and/or focused before entering the LPP chamber. Continuously pumped $CO_2$ amplifiers may be used for the system 22. For example, a suitable $CO_2$ laser device having an oscillator and three amplifiers (O-PA1-PA2-PA3 configuration) is disclosed in U.S. patent application Ser. No. 11/174,299 filed on Jun. 29, 2005, and entitled, LPP EUV LIGHT SOURCE DRIVE LASER SYSTEM, the entire contents of which are hereby incorporated by reference herein. Alternatively, the laser may be configured as a so-called "self-targeting" laser system in which the droplet serves as one mirror of the optical cavity. In some "self-targeting" arrangements, a master oscillator may not be required. Self-targeting laser systems are disclosed and claimed in U.S. patent application Ser. No. 11/580,414 filed on Oct. 13, 2006, entitled, DRIVE LASER DELIVERY SYSTEMS FOR EUV LIGHT SOURCE, the entire contents of which are incorporated by reference herein.

Depending on the application, other types of lasers may also be suitable, e.g., an excimer or molecular fluorine laser operating at high power and high pulse repetition rate. Examples include, a solid state laser, e.g., having a rod, fiber or disk-shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 24, e.g., delivering droplets of a target material into the interior of a chamber 26 to the irradiation region 28, where the droplets will interact with one or more light pulses, e.g., zero, one, or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $SnH_4$, as a tin alloy, e.g., tin-gallium alloys, tin-indium alloys, tin-indium-gallium alloys, or a combination thereof. Depending on the material used, the target material may be presented to the irradiation region at various temperatures including room temperature or near room temperature (e.g., tin alloys, $SnBr_4$), at an elevated temperature, (e.g., pure tin) or at temperatures below room temperature, (e.g., $SnH_4$), and in some cases, can be relatively volatile, e.g., $SnBr_4$. More details concerning the use of these materials in an LPP EUV source is provided in U.S. patent application Ser. No. 11/406,216, filed on Apr. 17, 2006, entitled ALTERNATIVE FUELS FOR EUV LIGHT SOURCE, the contents of which are hereby incorporated by reference herein.

Continuing with FIG. 1, the EUV light source 20 may also include an optic 30, e.g., a near-normal incidence collector mirror having a reflective surface in the form of a prolate spheroid (i.e., an ellipse rotated about its major axis). For example, the optic 30 may include a substrate made of silicon (single crystal or polycrystalline) or silicon carbide having a surface covered with a graded multi-layer coating with alternating layers of Molybdenum and Silicon, and in some cases one or more high temperature diffusion barrier layers, smoothing layers, capping layers and/or etch stop layers.

FIG. 1 shows that the optic 30 may be formed with an aperture to allow the light pulses generated by the system 22 to pass through and reach the irradiation region. As shown, the optic 30 may have an EUV reflective surface having the shape of a truncated prolate spheroid which has a first focus within or near the irradiation region 28, and a second focus at a so-called intermediate region 40, where the EUV light may be output from the EUV light source 20, and input to a device utilizing EUV light, e.g., an integrated circuit lithography tool (not shown). It is to be appreciated that other optics may be used in place of the prolate spheroid mirror for collecting and directing light to an intermediate location for subsequent delivery to a device utilizing EUV light, for example the optic may be in the form of a truncated paraboloid, or may be configured to deliver a beam having a ring-shaped cross-section to an intermediate location, see e.g., U.S. patent application Ser. No. 11/505,177 filed on Aug. 16, 2006, entitled EUV OPTICS, the contents of which are hereby incorporated by reference.

Continuing with reference to FIG. 1, the EUV light source 20 may also include an EUV controller 60, which may also include a firing control system 65 for triggering one or more lamps and/or laser devices in the system 22 to thereby generate light pulses for delivery into the chamber 26. The EUV light source 20 may also include a droplet position detection system which may include one or more droplet imagers 70, that provide an output indicative of the position of one or more droplets, e.g., relative to the irradiation region. The imager(s) 70 may provide this output to a droplet position detection feedback system 62, which can, e.g., compute a droplet position and/or trajectory, from which a droplet position error can be computed, e.g., on a droplet-by-droplet basis, or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region in the chamber 26.

The EUV light source 20 may include one or more EUV metrology instruments for measuring various properties of the EUV light generated by the source 20. These properties may include, for example, intensity (e.g., total intensity or intensity within a particular spectral band), spectral bandwidth, polarization, beam position, pointing, etc.

As further shown in FIG. 1, the EUV light source 20 may include a droplet control system 90, operable in response to a signal, which in some implementations may include the droplet error described above, or some quantity derived therefrom the controller 60, to e.g., modify the release point of the target material from a droplet source 92 and/or modify droplet formation timing, to correct for errors in the droplets arriving at the desired irradiation region, and/or synchronize the generation of droplets with the pulsed laser system 22.

More details regarding various droplet dispenser configurations and their relative advantages may be found in U.S. patent application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE; U.S. patent application Ser. No. 11/358,988 filed on Feb. 21, 2006, entitled LASER PRODUCED PLASMA EUV LIGHT SOURCE WITH PRE-PULSE; U.S. patent application Ser. No. 11/067,124 filed on Feb. 25, 2005, entitled METHOD AND APPARATUS FOR EUV PLASMA SOURCE TARGET DELIVERY; and U.S. patent application Ser. No. 11/174,443 filed on Jun. 29, 2005, entitled LPP EUV PLASMA SOURCE MATERIAL TARGET DELIVERY SYSTEM; the contents of each of which are hereby incorporated by reference.

FIG. 1 also shows that the light source 20 may include a vacuum system 100, e.g. including a vacuum pump, regulator, controller, etc., for evacuating the chamber 26 and maintaining the chamber at near vacuum, e.g., having a number density equivalent to a pressure less than about 1 torr at room temperature. Also, for some implementations, the light source 20 may include a gas system 102, e.g., including pressurized gas and/or gas pump, regulator, controller, etc., for introducing an etchant and/or ion slowing buffer gas into the chamber 26. For example, the etchant may be provided to clean or assist in cleaning debris from optics such as the optic 30 and may include $Cl_2$, $Br_2$, HBr, HI, HCl, $H_2$, $CF_3$, $CH_4$, H radicals, some other halogen-containing compound, or a combination thereof. Ion slowing buffer gas may include, but are not necessarily limited to, hydrogen, helium, argon or combinations thereof. For the light source 20, the etchant may be introduced into the chamber and/or present in the chamber 26 during operation (i.e., while the light source is generating EUV light) and/or during offline maintenance periods. It is to be appreciated that although small amounts of these gases may be introduced into the chamber, the overall chamber pressure may still be at near vacuum. FIG. 1 also schematically shows that the light source 20 may include a system 104 for controlling the temperature of the optic 30, while the optic 30 is in the chamber 28, e.g., in a near vacuum environment.

In more detail, FIGS. 2 and 3 illustrate that the system for controlling the temperature of the optic 30 may include a temperature controlled member 200 and a thermally conductive material 202. As shown, the optic 30 may be formed with a surface 204, e.g., the surface opposite the reflective surface 206, and the member 200 may be formed with a surface 208 conforming to the surface 204. With this arrangement, the surface 204 and surface 208 may fit together relatively closely.

During operation heat transfer between the optic 30 and member 200, it is anticipated that the conduction material 202 that is interposed between the optic 30 and member 200 will be in a liquid state, and thus, will provide an efficient conductive path between the optic 30 and member 200. Initially, the material 202 may be provided as a solid which is then melted to form a liquid, e.g., due to heat from the optic 30 (which may be heated by the plasma), the member 200, both, or some other heat source. For example, the material 202 may be initially provided as a solid film or foil, as shown in FIG. 3, or may be deposited on one or both of the surfaces 204, 208, for example using a vacuum deposition process. Alternatively, the material 200 may be initially provided as a liquid and then coated on one or both of the surfaces 204, 208.

In some cases, a flux may be used to wet the liquid metal on one or both of the surfaces 204, 208. For example, the member 200 may be assembled, heated, and wetted with liquid material 202 externally (i.e., outside the chamber 26), baked in an auxiliary chamber to remove any residual flux used, and then cooled to freeze the material 202. With the material 202 frozen, the member 200 may be installed in chamber 26, placed in contact with the optic 30 and then re-heated to melt the liquid metal. A slight contact pressure between the member 200 and optic 30 may be applied.

As shown in FIG. 2, the liquid material 202 may not necessarily be sealed between the member 200 and optic 30. Instead, the thermally conductive liquid material 202 may be held in place by interfacial surface tension. The composition of the particular liquid material will, typically, be made in light of the desired operational temperature of the optic 30 and the evaporation rate of the liquid material (since it may be exposed to near vacuum). Examples of suitable materials for the conductive liquid may include metals such as mercury, gallium, tin and indium.

In general, a layer of material 202 thick enough to compensate for imperfect matching of mating surface contours may be used. In some cases, material 202 that is thick enough to allow stress-free thermal contact with unequal thermal expansion coefficients of collector mirror and heat exchanger may be used. In some cases, it may be desirable for the liquid material 202 to have relatively low wetting on one of the surfaces 204, 208 allow for stress-free separation of the member 200 from the optic 30.

FIG. 4 shows an embodiment of a temperature controlled member (generally designated 200'), which includes a thermally conductive block 300, e.g., made of copper or aluminum, formed with one or more passageways 302 operable connected to a system 304, for flowing a heat exchange fluid, e.g., water, through the passageway(s) 302. For the member 200', the system 304 may include one or more of the following; fluid pump(s), regulator(s), heat exchanger(s) to add or remove heat from the fluid, temperature sensor(s), control system(s), etc. Depending on the particular application, the temperature controlled member 200' may be used to heat an optic, cool an optic, or both. For example, heating may be required prior to steady state conditions, followed by cooling.

Figure 5:
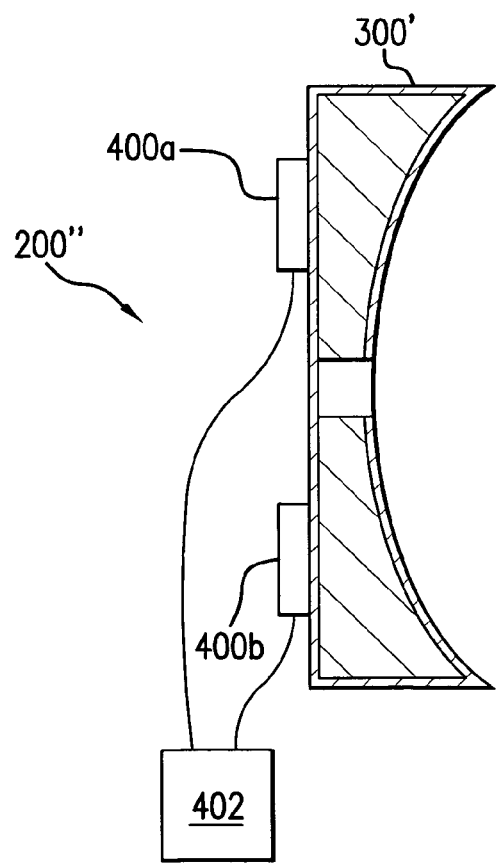
FIG. 5 shows a sectional view another embodiment of a temperature controlled member that is couple to a resistive heating system having one or more resistive elements connected via wires to an electrical current source sub-system.

FIG. 5 shows another embodiment of a temperature controlled member (generally designated 200") which includes a thermally conductive block 300', e.g. made of copper or aluminum, that is coupled to a resistive heating system having one or more resistive elements 400a,b that may be positioned on or in the block 300' and connected via wires to an electrical current source sub-system 402. For the member 200", the sub-system 402 may include one or more of the following; current source(s); signal generator(s), temperature sensor(s), control system(s), etc. Depending on the particular application, the temperature controlled member 200' may be used to heat an optic, cool an optic, or both. For example, heating may be required prior to steady state conditions, followed by cooling.

The resistive element(s) may be in the form of wire, filament, ribbon, foils, sheets, etc., and depending on the environment, e.g., the use of one or more etchants, the level of vacuum, etc., and the resistive material used, may be either bare or coated with a protective coating. Suitable resistive materials may include, but are not necessarily limited to molybdenum, tungsten or titanium. Suitable protective coatings for the resistive materials may include, but are not necessarily limited to silicon nitride, boron nitride and carbon. Each of the resistive elements 400a,b may be connected to a common current source or a plurality of independently operable current sources, a multi-channel current source may be employed, with each current source/channel passing current through one or more of the resistive elements. For the device, each current source may provide a continuous DC current or a signal generator may be employed to produce a more complicated waveform, e.g., AC, pulsed, square wave, etc.

As indicated above with reference to FIGS. 2 and 3, the liquid material 202 may not necessarily be sealed between the member 200 and optic 30. Instead, this added complexity (i.e., sealing) may be avoided by holding the thermally conductive liquid material 202 in place between the surfaces 204, 208 by interfacial surface tension. To this end, one, or in some cases both of the surfaces 204, 208 may be formed with a texture to wick the molten metal by capillary forces. FIG. 6 shows one example of a fine texture that may be employed to increase wetting between the surface and the liquid material 202. For example, a texture having feature sizes on the order of about 500 µm may be used, and may be formed on the surface by machining, e.g., cutting, grinding or sanding, or stamping. In some cases, it may be desirable to texturize one of the surfaces 204, 208 while leaving the other one smooth. For example, the member 200 may be made of metal and texturized while the optic 30 may have a substrate made of silicon or silicon carbide substrate polished to a relatively smooth surface. This may facilitate separation of the member 200 and optic 30.

In one arrangement, the back surface of the mirror intended for contact with the fluid may be textured and coated with a material to promote wetting by the heat transfer liquid. In some cases, the textured heater block surface can either be made of or coated with a material to promote wetting by the heat transfer fluid. Possible materials include copper (Cu), silver (Ag), or gold (Au).

FIG. 7 illustrates another system for controlling the temperature of an optic 30, which may include a temperature controlled member 200 (and which may include, e.g., passageways for flowing a heat exchange fluid (see FIG. 4) and/or resistive elements (see FIG. 5)), a thermally conductive material 202 and a structure 500 formed with a plurality of through-holes 502 (see FIG. 8). As shown in FIG. 7, the structure 500 may be interposed between the surface 204 and surface 208 to retain the liquid material 202 between the surfaces by interfacial surface tension. With this arrangement, the liquid material 202 may not necessarily be sealed between the member 200 and optic 30. FIG. 8 shows that the structure 500 may be a fine mesh formed with a plurality of hexagonal openings. Other structures which promote wicking may be used, e.g., a porous film, mesh with circular openings, etc. For the system shown in FIG. 7, the surfaces 204, 208 may be smooth or texturized.

Figure 9:
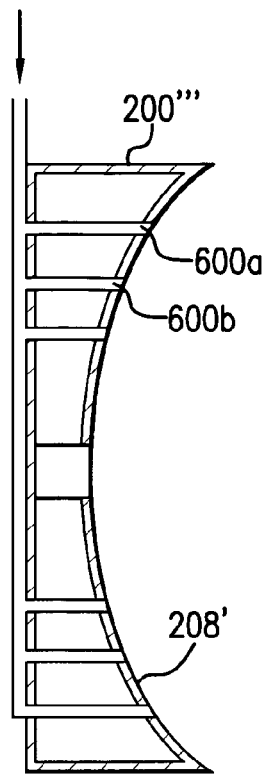
FIG. 9 shows a sectional view of a member that can be used to introduce a conductive liquid material between the surface of a temperature controlled member and the surface of the optic after the member and optic have been brought together in contact/near contact.
Figure 10:
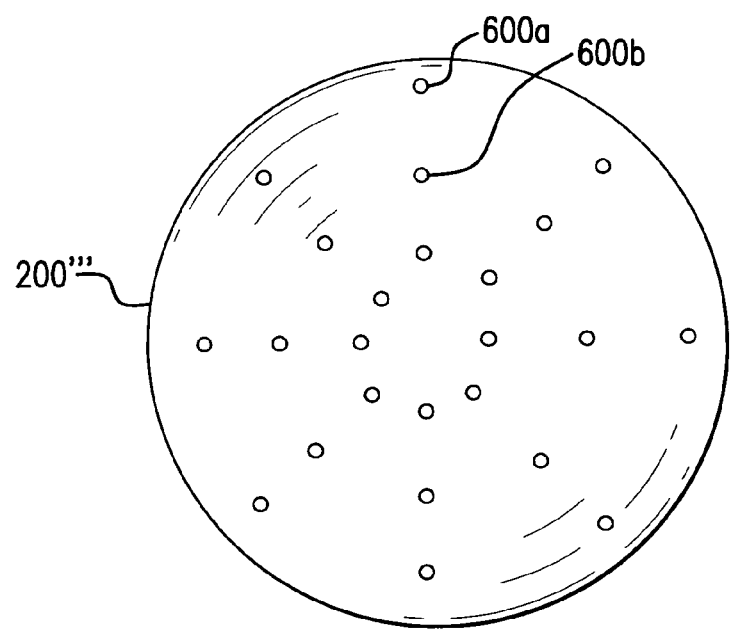
FIG. 10 shows a front view of the member shown in FIG. 9.

FIGS. 9 and 10 show an example of a member 200''' that can be used to introduce liquid material 202 between the surface 208 and the surface 204 of the optic 30 (see FIG. 3) after the member 200''' and optic 30 have been brought together in contact/near contact. As shown, the member 200''' may be formed with a plurality of ports (of which ports 600a and 600b have been labeled). With this arrangement, the member 200''' can be installed in EUV chamber 26 dry (i.e., without any liquid material 202 on surface 208'. Next, an etchant such as $Cl_2$, $Br_2$, HBr, HI, HCl, $H_2$, $CF_3$, $CH_4$, H radicals, some other halogen-containing compound, or combinations thereof, may be introduced into the plasma chamber to clean the surface 208' (which may be textured) of the member 200''' and enhance wetting. Once cleaned, a controlled volume of liquid material 202 can be pumped in the direction of arrow 602 and through ports 600a,b, and into the gap between the member 200''' and optic 30. Member 200''' may include, passageways for flowing a heat exchange fluid (see FIG. 4) and/or resistive elements (see FIG. 5) for temperature control. A structure 500 such as the mesh shown in FIGS. 7 and 8 may be used with the member 200'''.

The arrangements described above may be used to heat or cool the optic through and maintain the optic within a specific temperature range. For example, when tin or a material including tin is used as a target material for generating a plasma and an etchant is employed, such as a halogen based etchant, the reflective surface of the optic may be maintained at temperature in the range of 150-400° C. to initiate reaction and/or increase the chemical reaction rate of the etchant and/or to maintain the etching rate at a certain level. For some etchants, such as hydrogen radicals, the reflective surface of the optic may be maintained at temperature in the range of 20-60° C. to initiate reaction and/or increase the chemical reaction rate. On the other hand, when Lithium is used as a target material for generating a plasma, the reflective surface of the optic may be maintained at temperature greater than about 400° C. to vaporize deposited Lithium.

While the particular embodiment(s) described and illustrated in this Patent Application in the detail required to satisfy 35 U.S.C. §112, are fully capable of attaining one or more of the above-described purposes for, problems to be solved by, or any other reasons for or objects of the embodiment(s) above-described, it is to be understood by those skilled in the art, that the above-described embodiment(s) are merely exemplary, illustrative and representative of the subject matter which is broadly contemplated by the present application. Reference to an element in the following Claims in the singular, is not intended to mean, nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art, are expressly incorporated herein by reference and are intended to be encompassed by the present Claims. Any term used in the Specification and/or in the Claims and expressly given a meaning in the Specification and/or Claims in the present Application shall have that meaning, regardless of any dictionary or other commonly used meaning for such a term. It is not intended or necessary for a device or method discussed in the Specification as an embodiment to address or solve each and every problem discussed in this Application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

I/We claim:

1. A device, comprising:
   an optic disposed in a near vacuum environment, said optic formed with a surface portion;
   a temperature controlled member formed with a surface portion conforming to said optic surface portion; and
   a liquid interposed between said optic surface portion and said member surface portion to conduct heat therebetween.

2. A device as recited in claim 1 wherein at least one of said member surface portion and said optic surface portion is formed with a solid texture to promote spontaneous invasion of the liquid by interfacial surface tension.

3. A device as recited in claim 1 wherein said liquid is a metal comprises an element selected from the group of elements consisting of mercury, gallium, tin and indium.

4. A device as recited in claim 1 further comprising a structure formed with a plurality of through-holes, the structure interposed between said member surface portion and said optic surface portion to retain said liquid between said surfaces by interfacial surface tension.

5. A device as recited in claim 4 wherein said structure comprises a mesh.

6. A device as recited in claim 1 wherein said optic is a mirror having a substrate and a surface portion covered with a multi-layer reflective coating.

7. A device as recited in claim 6 wherein said mirror substrate is made of a material selected from the group of materials consisting of silicon and silicon carbide.

8. A device as recited in claim 1 wherein said temperature controlled member comprises a conductive block formed with at least one passageway for flowing a heat exchange fluid therethrough.

9. A device as recited in claim 1 wherein said temperature controlled member comprises a conductive block coupled to at least one resistive heater.

10. A device, comprising:
an optic;
a temperature controlled member; and
a non-sealing means for maintaining a liquid metal between said optic and said member to conduct heat therebetween.

11. A device as recited in claim 10 wherein said optic is located in an environment maintained at below atmospheric pressure.

12. A device as recited in claim 10 wherein said non-sealing means comprises a surface texture formed on at least one of said temperature controlled member and said optic.

13. A device as recited in claim 10 wherein said non-sealing means comprises a structure formed with a plurality of through-holes, the structure interposed between said member and said optic.

14. A device as recited in claim 10 wherein said optic comprises a substrate made of a material comprising silicon.

15. A device as recited in claim 10 wherein said temperature controlled member comprises a conductive block formed with at least one passageway for flowing a heat exchange fluid.

16. A device as recited in claim 10 wherein said temperature controlled member comprises a conductive block coupled to at least one resistive heater.

17. A method comprising the steps of:
disposing an optic in a near vacuum environment, said optic formed with a surface portion;
providing a temperature controlled member formed with a surface portion conforming to said optic surface portion; and
interposing a liquid material between said optic surface portion and said member surface portion to conduct heat therebetween.

18. A method as recited in claim 17 wherein said interposing step comprises the sub-steps of:
solidifying the material on at least one of said member surface portion and said optic surface portion;
juxtaposing said member surface portion with said optic surface portion; and
heating said material to liquefy said material.

19. A method as recited in claim 17 wherein at least one of said member surface portion and said optic surface portion is formed with a solid texture to promote spontaneous invasion of the liquid by interfacial surface tension.

20. A method as recited in claim 17 further comprising the steps of:
providing a structure formed with a plurality of through-holes; and
positioning the structure between said member surface portion and said optic surface portion to retain said liquid between said surfaces by interfacial surface tension.

* * * * *